(12) United States Patent
Kenyon

(10) Patent No.: US 10,825,489 B2
(45) Date of Patent: Nov. 3, 2020

(54) LATCHING SENSE AMPLIFIER

(71) Applicant: TEXAS INSTRUMENTS INCORPORATED, Dallas, TX (US)

(72) Inventor: Eleazar Walter Kenyon, Tucker, GA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/116,049

(22) Filed: Aug. 29, 2018

(65) Prior Publication Data

US 2020/0075064 A1    Mar. 5, 2020

(51) Int. Cl.
G11C 7/06    (2006.01)
G11C 7/08    (2006.01)

(52) U.S. Cl.
CPC .............. *G11C 7/065* (2013.01); *G11C 7/08* (2013.01)

(58) Field of Classification Search
CPC ................................. G11C 7/065; G11C 7/08
USPC ........................................................ 365/207
See application file for complete search history.

(56) References Cited

U.S. PATENT DOCUMENTS

| | | | | |
|---|---|---|---|---|
| 5,280,205 A * | 1/1994 | Green | ..................... | G11C 7/065 327/185 |
| 5,504,443 A * | 4/1996 | Gross | ..................... | G11C 7/062 327/185 |
| 5,546,026 A * | 8/1996 | Lin | ......................... | G11C 7/062 327/52 |
| 5,596,539 A * | 1/1997 | Passow | .................... | G11C 7/08 365/189.11 |
| 6,181,621 B1 * | 1/2001 | Lovett | .................... | G11C 7/065 365/205 |
| 6,433,589 B1 * | 8/2002 | Lee | ........................ | G11C 7/065 326/112 |
| 6,747,485 B1 * | 6/2004 | Suryanarayana | .... | G11C 7/1078 327/197 |
| 7,019,999 B1 * | 3/2006 | Srinivasan | ............. | G11C 15/04 365/168 |
| 7,099,218 B2 * | 8/2006 | Wicht | .................... | G11C 7/062 365/207 |
| 7,893,726 B1 * | 2/2011 | Ho | ......................... | G11C 7/065 327/52 |
| 9,679,620 B1 * | 6/2017 | Yun | ........................ | G11C 7/065 |
| 10,091,031 B1 * | 10/2018 | Dimitriu | .......... | H04L 25/03146 |

(Continued)

OTHER PUBLICATIONS

International Search Report in corresponding PCT Application No. PCT/US2019/047739, dated Nov. 21, 2019 (2 pages).

*Primary Examiner* — Sung Il Cho
(74) *Attorney, Agent, or Firm* — John R. Pessetto; Charles A. Brill; Frank D. Cimino

(57) ABSTRACT

A latching sense amplifier includes an input stage and an output stage. The output stage is coupled to the input stage. The output stage includes a first output node, a second output node, a pull-up circuit, and a pull-down circuit. The pull-up circuit includes a first transistor, a second transistor, and a latch circuit. The first transistor is configured to pull up the first output node. The second transistor is configured to pull up the second output node. The latch circuit is configured to control the first transistor and the second transistor. The pull-down circuit includes a latch circuit configured to pull-down the first output node based on a voltage of the second output node.

10 Claims, 3 Drawing Sheets

(56) References Cited

U.S. PATENT DOCUMENTS

| | | | |
|---|---|---|---|
| 2007/0019467 A1* | 1/2007 | Toda | G11C 16/0483 |
| | | | 365/185.2 |
| 2012/0300566 A1* | 11/2012 | Mueller | G11C 7/12 |
| | | | 365/203 |
| 2013/0064019 A1* | 3/2013 | Frederick, Jr. | G11C 7/12 |
| | | | 365/189.05 |
| 2013/0070538 A1* | 3/2013 | Sugamoto | G11C 7/14 |
| | | | 365/189.05 |
| 2013/0148453 A1* | 6/2013 | John | G11C 7/065 |
| | | | 365/210.1 |
| 2013/0257483 A1 | 10/2013 | Bulzacchelli | |
| 2014/0003160 A1* | 1/2014 | Trivedi | G11C 7/065 |
| | | | 365/189.02 |
| 2016/0336933 A1* | 11/2016 | Krishna | H03K 5/2481 |
| 2017/0243622 A1* | 8/2017 | Sandhu | G11C 7/062 |
| 2018/0108414 A1* | 4/2018 | Kimura | G11C 11/2273 |
| 2018/0137928 A1 | 5/2018 | Qiu et al. | |

* cited by examiner

LATCHING SENSE AMPLIFIER

BACKGROUND

Sense amplifiers are used in a wide variety of applications such as analog-to-digital converters and high-speed data communication receivers. The sense amplifier converts the difference of two signals received as input to a higher voltage signal, such as a logic level signal, suitable for use in digital circuitry. The sense amplifier may include latch circuitry to generate the logic level signal.

SUMMARY

A latching sense amplifier with reduced power consumption and clock loading is disclosed herein. In one example, a latching sense amplifier includes an input stage and an output stage. The input stage includes a clocked differential amplifier. The output stage includes a first output node, a second output node, a pull-up circuit, and a pull-down circuit. The pull-up circuit includes a first transistor, a second transistor, a third transistor, and a fourth transistor. The second transistor is cross-coupled with the first transistor. The third transistor is controlled by the first transistor, and is configured to pull up the first output node. The fourth transistor is controlled by the second transistor, and is configured to pull up the second output node. The pull-down circuit includes a fifth transistor and a sixth transistor. The fifth transistor is configured to pull down the first output node. The sixth transistor is configured to pull down the second output node. The fifth transistor and the sixth transistor are cross-coupled.

In another example, a latching sense amplifier includes an input stage and an output stage. The output stage is coupled to the input stage. The output stage includes a first output node, a second output node a pull-up circuit, and a pull-down circuit. The pull-up circuit includes a first transistor, a second transistor, and a latch circuit. The first transistor is configured to pull up the first output node. The second transistor is configured to pull up the second output node. The latch circuit is configured to control the first transistor and the second transistor. The pull-down circuit includes a latch circuit configured to pull-down the first output node based on a voltage of the second output node.

In a further example, a latching sense amplifier includes an input stage and an output stage. The output stage is coupled to the input stage. The output stage includes a first output node, a second output node, a pull-down circuit, and pull-up circuit. The pull-down circuit is coupled to the first output node and the second output node. The pull-up circuit is coupled to the first output node and the second output node. The pull-up circuit includes a first transistor, a second transistor, a third transistor, a fourth transistor, a fifth transistor, and a sixth transistor. The second transistor is cross-coupled with the first transistor. The third transistor includes a control terminal and an output terminal. The control terminal is coupled to an output terminal of the first transistor. The output terminal coupled to the first output node. The fourth transistor includes a control terminal and an output terminal. The control terminal of the fourth transistor is coupled to an output terminal of the second transistor. The output terminal of the fourth transistor is coupled to the second output node. The fifth transistor includes a control terminal and an input terminal. The control terminal of the fifth transistor coupled to the first output node. The input terminal of the fifth transistor is coupled to a control terminal of the second transistor. The sixth transistor includes a control terminal and an input terminal. The control terminal of the sixth transistor is coupled to the second output node. The input terminal of the sixth transistor is coupled to a control terminal of the first transistor.

BRIEF DESCRIPTION OF THE DRAWINGS

For a detailed description of various examples, reference will now be made to the accompanying drawings in which.

DETAILED DESCRIPTION

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

Figure 1:
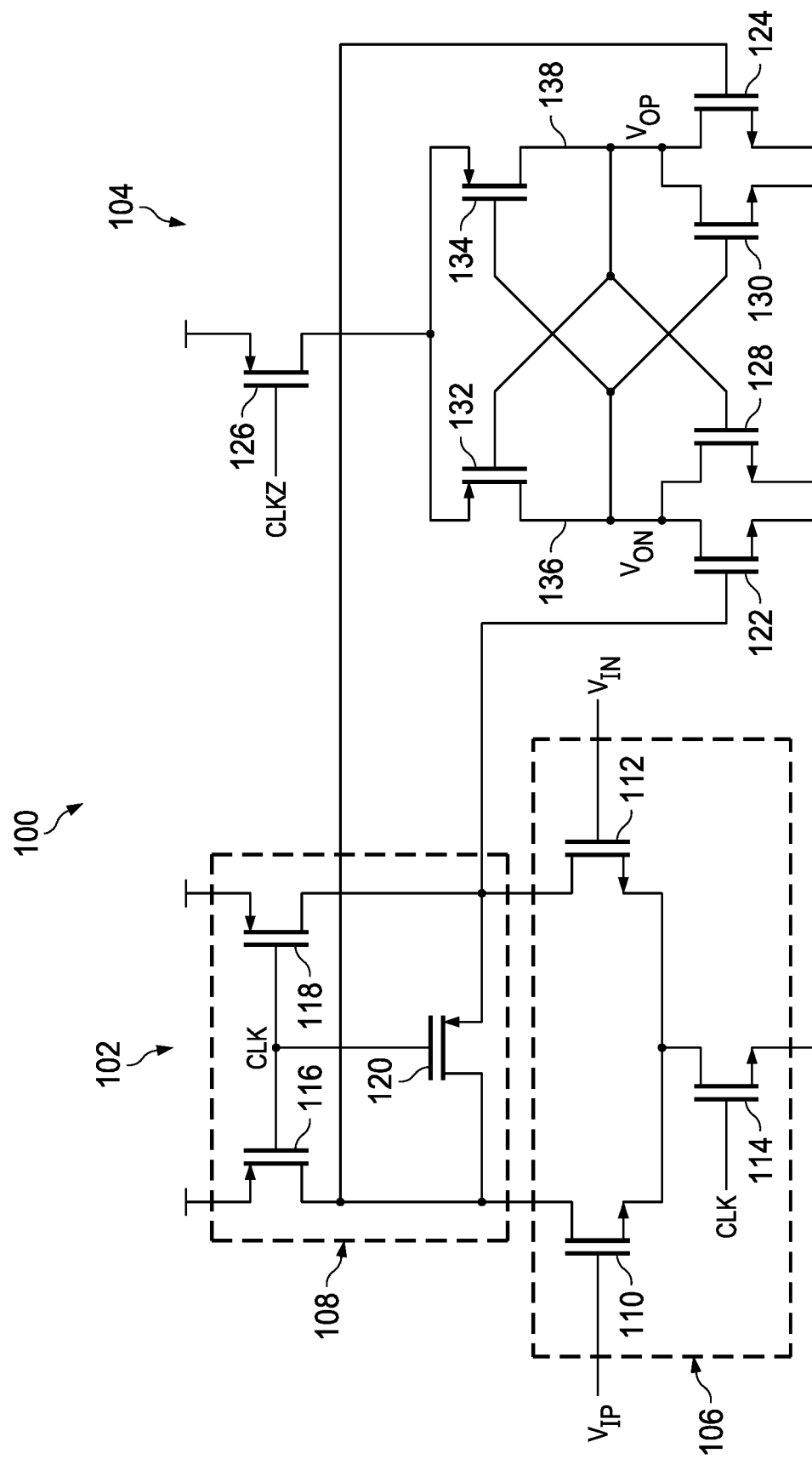
FIG. 1 shows a schematic diagram for a double-tail sense amplifier latch.

FIG. 1 shows a schematic diagram for a double-tail latching sense amplifier 100. The double-tail latching sense amplifier 100 provides good performance with a relatively low number of transistors, but requires a multi-phase clocking, and the output stage includes stacked P-MOS transistors that must be relatively large to provide high output drive. The double-tail latching sense amplifier 100 includes an input stage 102 and an output stage 104. When a clock signal provided to the double-tail latching sense amplifier 100 is "low" the double-tail latching sense amplifier 100 is reset, and when the clock signal is "high" the double-tail latching sense amplifier 100 latches a value based on differential input signals provided to the double-tail latching sense amplifier 100.

The input stage 102 includes a clocked differential amplifier 106 and a reset circuit 108. The clocked differential amplifier 106 includes a transistor 110, a transistor 112, and a tail transistor 114. The transistor 110 and the transistor 112 are connected as a differential amplifier to receive differential input signals VIP and VIN. The transistor 110, the transistor 112, and the tail transistor 114 may be negative-channel (N-channel) metal oxide semiconductor field effect transistors (MOSFETs). The tail transistor 114 is turned on when the clock signal provided to the double-tail latching sense amplifier 100 is "high" to connect the sources of the transistor 110 and the transistor 112 to ground and to allow a differential voltage to develop across the drains of the transistor 110 and the transistor 112.

The reset circuit 108 is connected to the drain terminals of the transistor 110 and the transistor 112. The reset circuit 108 includes a transistor 116, a transistor 118, and a transistor 120. The transistor 116, the transistor 118, and the transistor 120 may be positive-channel (P-channel) MOSFETs. When the clock signal provided to the double-tail latching sense amplifier 100 is "low," the transistor 116, the transistor 118, and transistor 120 are turned on to pull up the drain terminals of the transistor 110 and the transistor 112.

The output stage 104 includes input transistor 122, input transistor 124, tail transistor 126, latch transistor 128, latch transistor 130, latch transistor 132, and latch transistor 134. The input transistor 122, the input transistor 124, the latch transistor 128, and the latch transistor 130 may be N-channel MOSFETs. The tail transistor 126, the latch transistor 132, and the latch transistor 134 may be P-channel MOSFETs. The tail transistor 126 must be relatively large to provide sufficient current to quickly switch large loads. The input transistor 122 and the input transistor 124 are controlled by the input stage 102. The input transistor 122 is coupled to the drain of the transistor 112, and the input transistor 124 is coupled to the drain of the transistor 110. When the reset circuit 108 is active, tail transistor 126 is turned off, and the input transistor 122 and the input transistor 124 pull the output node 136 and the output node 138 of the output stage 104 to ground. The tail transistor 126 is controlled by an inverted version of the clock signal applied to the tail transistor 114. Accordingly, the tail transistor 126 and the tail transistor 114 are turned on during the same phase of the clock signal.

The latch transistor 128 and the latch transistor 132 are coupled to form a first inverter. The latch transistor 130 and the latch transistor 134 are coupled for form a second inverter that is cross-coupled with the first inverter to form a latch. When the tail transistor 114 and the tail transistor 126 are turned on, a differential voltage at the gates of the transistor 110 and the transistor 112 produces a differential voltage at the drains of the transistor 110 and the transistor 112, which in turn drives the input transistor 122 and the input transistor 124 to produce a differential voltage at the output node 136 and the output node 138. As the differential voltage at the output node 136 and output node 138 increases, one of the latch transistor 128 or the latch transistor 130 turns on, and positive feedback within the latch causes the output node 136 and output node 138 to swing to the power supply rails.

Figure 2:
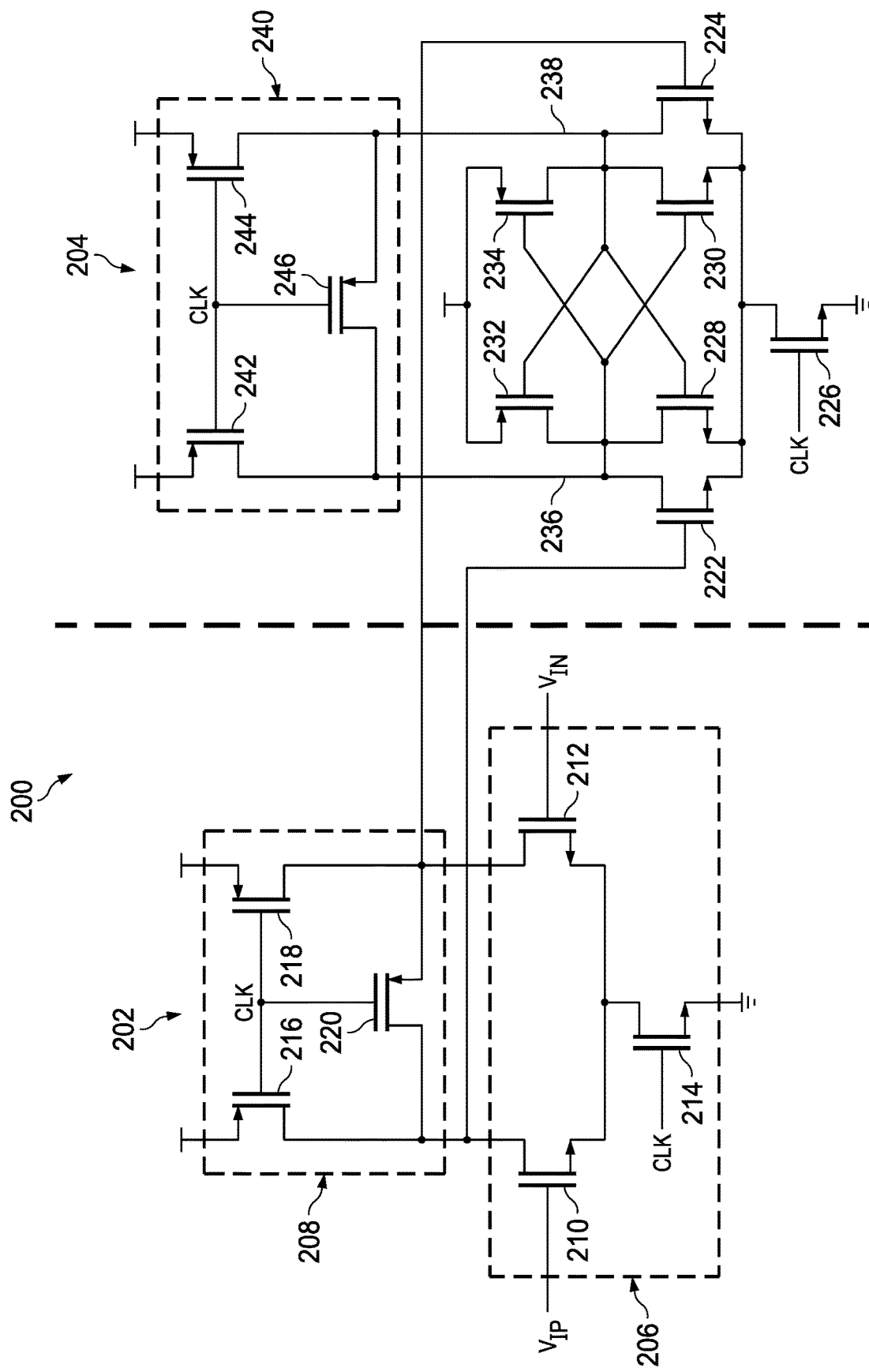
FIG. 2 shows a schematic diagram for a two-stage N-MOS sense amplifier latch.

FIG. 2 show a schematic diagram for a two-stage N-MOS sense amplifier latch 200. Unlike the double-tail latching sense amplifier 100, the two-stage N-MOS sense amplifier latch 200 uses a single clock phase and does not include stacked P-channel MOSFETs, however, the output pull-up drive strength is limited. The two-stage N-MOS sense amplifier latch 200 includes an input stage 202 and an output stage 204. When a clock signal provided to the two-stage N-MOS sense amplifier latch 200 is "low" the two-stage N-MOS sense amplifier latch 200 is reset, and when the clock signal is "high" the two-stage N-MOS sense amplifier latch 200 latches a value based on differential input signals provided to the two-stage N-MOS sense amplifier latch 200.

The input stage 202 includes a clocked differential amplifier 206 and a reset circuit 208. The clocked differential amplifier 206 includes a transistor 210, a transistor 212, and a tail transistor 214. The transistor 210 and the transistor 212 are connected as a differential amplifier to receive differential input signals VIP and VIN. The transistor 210, the transistor 212, and the tail transistor 214 may be N-channel MOSFETs. The tail transistor 214 is turned on when the clock signal provided to the two-stage N-MOS sense amplifier latch 200 is "high" to connect the sources of the transistor 210 and the transistor 212 to ground and to allow a differential voltage to develop across the drains of the transistor 210 and transistor 212.

The reset circuit 208 is connected to the drain terminals of the transistor 210 and the transistor 212. The reset circuit 208 includes a transistor 216, a transistor 218, and a transistor 220. The transistor 216, the transistor 218, and the transistor 220 may be P-channel MOSFETs. When the clock signal provided to the two-stage N-MOS sense amplifier latch 200 is "low," the transistor 216, the transistor 218, and transistor 220 are turned on to pull up the drain terminals of the transistor 210 and the transistor 212.

The output stage 204 includes input transistor 222, input transistor 224, tail transistor 226, latch transistor 228, latch transistor 230, latch transistor 232, latch transistor 234, and reset circuit 240. The reset circuit 240 includes transistor 242, transistor 244, and transistor 246. The input transistor 222, the input transistor 224, the latch transistor 228, the latch transistor 230, and the tail transistor 226 may be N-channel MOSFETs. The latch transistor 232, the latch transistor 234, the transistor 242, the transistor 244, and the transistor 246 may be P-channel MOSFETs. The reset circuit 240 is similar to the reset circuit 208. When the clock signal provided to the two-stage N-MOS sense amplifier latch 200 is "low," the transistor 242, the transistor 244, and the transistor 246 are turned on to pull up the output node 236 and the output node 238.

The input transistor 222 and the input transistor 224 are controlled by the input stage 202. The input transistor 222 is coupled to the drain of the transistor 210, and the input transistor 224 is coupled to the drain of the transistor 212. The tail transistor 226 is controlled by the clock signal provided to the two-stage N-MOS sense amplifier latch 200. When the clock signal is "high" the tail transistor 226 is turned on to connect the input transistor 222, the input transistor 224, the latch transistor 228, and the latch transistor 230 to ground. Accordingly, the tail transistor 226 and the tail transistor 214 are turned on during the same phase of the clock signal.

The latch transistor 228 and the latch transistor 232 are coupled to form a first inverter. The latch transistor 230 and the latch transistor 234 are coupled to form a second inverter that is cross-coupled with the first inverter to form a latch. When the tail transistor 214 and the tail transistor 226 are turned on, a differential voltage at the gates of the transistor 210 and the transistor 212 produces a differential voltage at the drains of the transistor 210 and the transistor 212, which in turn drives the input transistor 222 and the input transistor 224 to produce a differential voltage at the output node 236 and the output node 238. As the differential voltage at the output node 236 and output node 238 increases, one of the latch transistor 228 or the latch transistor 230 turns on, and positive feedback within the latch causes the output node 236 and output node 238 to swing to the power supply rails.

Figure 3:
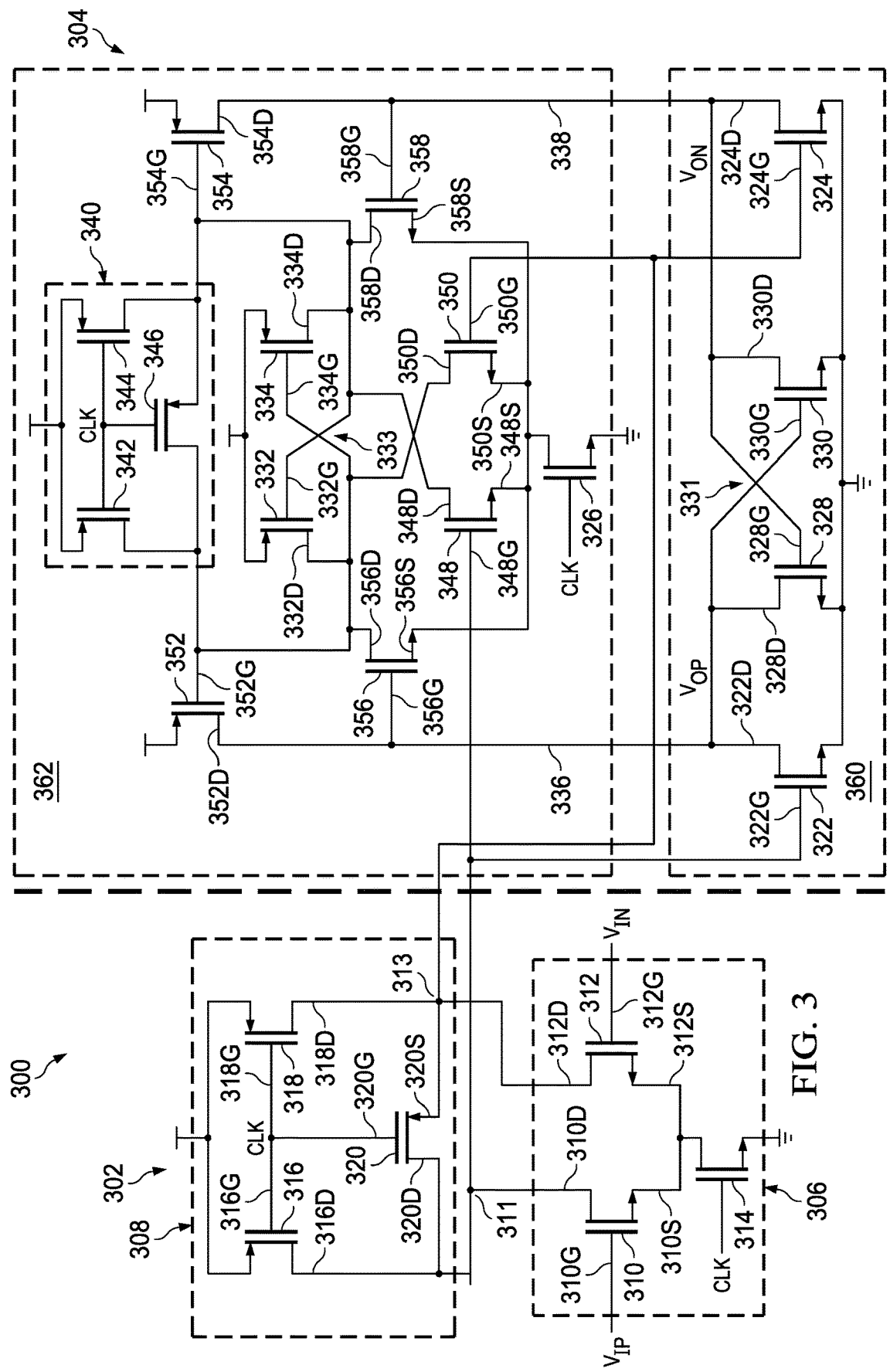
FIG. 3 shows a schematic diagram for a latching sense amplifier in accordance with the present disclosure.

FIG. 3 shows a schematic diagram for a latching sense amplifier 300 in accordance with the present disclosure. The latching sense amplifier 300 includes some circuitry that is similar to that of the double-tail latching sense amplifier 100 or the two-stage N-MOS sense amplifier latch 200, and the latching sense amplifier 300 provides a number of advantages over the double-tail latching sense amplifier 100 and the two-stage N-MOS sense amplifier latch 200. For example, the latching sense amplifier 300 has lower clock loading than the double-tail latching sense amplifier 100 while providing similar performance, and in contrast to the double-tail latching sense amplifier 100, the latching sense amplifier 300 requires only one clock phase. The latching sense amplifier 300 does not include stacked P-channel MOSFETs, which allows the size of the P-channel MOSFETs to be reduced.

The latching sense amplifier 300 includes an input stage 302 and an output stage 304. When a clock signal provided to the latching sense amplifier 300 is "low" the latching sense amplifier 300 is reset, and when the clock signal is "high" the latching sense amplifier 300 latches a value based on differential input signals provided to the latching sense amplifier 300. The input stage 302 includes a clocked differential amplifier 306 and a reset circuit 308. The clocked differential amplifier 306 includes a transistor 310, a transistor 312, and a tail transistor 314. An output terminal (e.g., source terminal) 310S of the transistor 310 is connected to an output terminal (e.g., source terminal) 312S of the transistor 312 to form a differential amplifier that receives differential input signals VIP and VIN. The transistor 310, the transistor 312, and the tail transistor 314 may be N-channel MOSFETs. The tail transistor 314 is turned on when the clock signal provided to the latching sense amplifier 300 is "high" to connect the sources of the transistor 310 and the transistor 312 to ground and to allow a differential voltage to develop across the drains of the transistor 310 and transistor 312. The transistor 310 drives the output node 311 of the input stage 302, and the transistor 312 drives the output node 313 of the input stage 302.

The reset circuit 308 is connected to the input terminal (e.g., drain terminal) 310D of the transistor 310 and the input terminal (e.g., drain terminal) 312D of the transistor 312. The reset circuit 308 includes a transistor 316, a transistor 318, and a transistor 320. The transistor 316, the transistor 318, and the transistor 320 may be P-channel MOSFETs. When the clock signal provided to the latching sense amplifier 300 is "low," the transistor 316, the transistor 318, and transistor 320 are turned on to pull up the drain terminals of the transistor 310 and the transistor 312, and the output nodes 311 and 313. The transistor 316 includes an output terminal (e.g., drain terminal) 316D that is connected to the input terminal 310D of the transistor 310. The transistor 318 includes an output terminal (e.g., drain terminal) 318D that is connected to the input terminal 312D of the transistor 312. The transistor 320 includes a control terminal (e.g., gate terminal) 320G that is connected to a control terminal (e.g., gate terminal) 316G of the transistor 316 and a control terminal (e.g., gate terminal) 318G of the transistor 318. An input terminal (e.g., source terminal) 320S of the transistor 320 is connected to one of the output terminal 316D of the transistor 316 or the output terminal 318D of the transistor 318, and an output terminal (e.g., drain terminal) 320D of the transistor 320 is connected to one of the output terminal 316D of the transistor 316 or the output terminal 318D of the transistor 318.

The output stage 304 is coupled to the input stage 302, and includes a pull-down circuit 360 and a pull-up circuit 362. The pull-down circuit 360 pulls the output node 336 and the output node 338 to ground, and the pull-up circuit 362 pulls the output node 336 and the output node 338 up to a power supply rail.

The pull-up circuit 362 includes input transistor 348, input transistor 350, tail transistor 326, transistor 332, transistor 334, transistor 352, transistor 354, transistor 356, transistor 358, and reset circuit 340. The reset circuit 340 includes transistor 342, transistor 344, and transistor 346. The input transistor 348, the input transistor 350, the tail transistor 326, the transistor 356, and the transistor 358 may be N-channel MOSFETs. The transistor 332, the transistor 334, the transistor 342, the transistor 344, and the transistor 346 may be P-channel MOSFETs. When the clock signal provided to the latching sense amplifier 300 is "low," the transistor 342, the transistor 344, and the transistor 346 are turned on to pull up the control terminals (e.g., the gate terminals) 352G, 354G, 332G, and 334G of the transistor 352, the transistor 354, the transistor 332, and the transistor 334 respectively, thereby turning off the transistor 352, the transistor 354, the transistor 332, and the transistor 334, and disabling the transistor 352 and the transistor 354 from pulling up the output node 336 and the output node 338.

The transistor 332 and the transistor 334 are cross-coupled to form a latch circuit 333. A control terminal (e.g., gate terminal) 332G of the transistor 332 is connected to an output terminal (e.g., drain terminal) 334D of the transistor 334. A control terminal (e.g., gate terminal) 334G of the transistor 334 is connected to an output terminal (e.g., drain terminal) 332D of the transistor 332.

The output terminal (i.e., drain terminal) 352D of the transistor 352 is coupled to the output node 336 to pull up the output node 336. The 352G is connected to the output terminal 332D of the transistor 332. The output terminal (i.e., drain terminal) 354D of the transistor 354 is coupled to the output node 338 to pull up the output node 338. The 354G is connected to the output terminal 334D of the transistor 334. Thus, in the latching sense amplifier 300, the output node 336 and the output node 338 are each pulled up via a single transistor.

The transistor 356 and the transistor 358 provide feedback from the output node 336 and the output node 338 to the transistor 332 and the transistor 334. The control terminal (i.e., gate terminal) 356G of the transistor 356 is coupled to the output node 336. The input terminal (e.g., drain terminal) 356D of the transistor 356 is connected to the control terminal 334G of the transistor 334 to pull down the control terminal 334G. The control terminal (i.e., gate terminal) 358G of the transistor 358 is coupled to the output node 338. The input terminal (e.g., drain terminal) 358D of the transistor 358 is connected to the control terminal 332G of the transistor 332 to pull down the control terminal 332G.

The input transistor 348 and the input transistor 350 are controlled by the input stage 302. The control terminal (i.e., gate terminal) 348G of the input transistor 348 is coupled to the output node 311 of the input stage 302. The output terminal (i.e., source terminal) 348S of the transistor 348 is coupled to the output terminal (i.e., source terminal) 356S of the transistor 356. The input terminal (i.e., drain terminal) 348D of the transistor 348 is coupled to the control terminal 332G of the transistor 332. The control terminal (i.e., gate terminal) 350G of the input transistor 350 is coupled to the output 313 of the input stage 302. The output terminal (i.e., source terminal) 350S of the transistor 350 is coupled to the output terminal (i.e., source terminal) 358S of the transistor 358. The input terminal (i.e., drain terminal) 350D of the transistor 350 is coupled to the control terminal 334G of the transistor 334. The tail transistor 326 is controlled by the clock signal provided to the latching sense amplifier 300. When the clock signal is "high" the tail transistor 326 is turned on to connect the input transistor 348, the input transistor 350, the transistor 356, and the transistor 358 to ground. Accordingly, the tail transistor 326 and the tail transistor 314 are turned on during the same phase of the clock signal.

When the reset circuit 308 is inactive, a differential voltage at the control terminals (e.g., gate terminals) 310G and 312G of the transistor 310 and the transistor 312 produces a differential voltage at the input terminals input terminal 310D and input terminal 312D of the transistor 310 and the transistor 312, which in turn drives the input transistor 348 and the input transistor 350 to produce a differential voltage at the control terminal 332G of the transistor 332, the control terminal 334G of the transistor 334, the control terminal 352G of the transistor 352, and the control terminal 354G of the transistor 354. As the differential voltage increases, one of the transistor 332 and the transistor 334 turns on, and one of the transistor 352 and the transistor 354 turns on. Positive feedback from the output node 336 and the output node 338 and between the transistor 332 and the transistor 334 latches the state of the pull-up circuit 362.

The pull-down circuit 360 includes a transistor 322, a transistor 324, a transistor 328, and a transistor 330. The transistor 322 and the transistor 324 are respectively coupled to the output nodes 311 and 313 of the input stage 302, and controlled by the input stage 302. The transistor 322 includes a control terminal (e.g., gate terminal) 322G that is connected to the input terminal 310D of the transistor 310. The transistor 324 includes a control terminal (e.g., gate terminal) 324G that is connected to the input terminal 312D of the transistor 312. An input terminal (e.g., drain terminal) 322D of the transistor 322 is connected to the output node 336 of the latching sense amplifier 300, and an input terminal (e.g., drain terminal) 324D of the transistor 324 is connected to the output node 338 of the latching sense amplifier 300.

The transistor 328 and the transistor 330 are cross-coupled to form a latch circuit 331. A control terminal (e.g., gate terminal) 328G of the transistor 328 is connected to an input terminal (e.g., drain terminal) 330D of the transistor 330, the input terminal 324D of the transistor 324, and the output node 338. A control terminal (e.g., gate terminal) 330G of the transistor 330 is connected to an input terminal (e.g., drain terminal) 328D of the transistor 328, the input terminal 322D of the transistor 322, and the output node 336.

When the reset circuit 308 is active, the transistor 322 and the transistor 324 pull the output node 336 and the output node 338 of the output stage 304 to ground. When the reset circuit 308 is inactive, a differential voltage at the control terminals (e.g., gate terminals) 310G of the transistor 310 and 312G of the transistor 312 produces a differential voltage at the input terminal 310D of the transistor 310 and the input terminal 312D of the transistor 312, which in turn drives the transistor 322 and the transistor 324 to produce a differential voltage at the output node 336 and the output node 338. As the differential voltage at the output node 336 and output node 338 increases, one of the transistor 352 and the transistor 354 turns on, which causes one of the transistor 328 and the transistor 330 to turns on and pull a corresponding one of the output node 336 and the output node 338 to ground. Positive feedback from the output node 336 and the output node 338 and between the transistor 328 and the transistor 330 latches the state of the pull-down circuit 360. Thus, in the latching sense amplifier 300, the output node 336 and the output node 338 are each pulled down via a single transistor.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A sense amplifier, comprising:
an input stage comprising a clocked differential amplifier; and
an output stage comprising:
 a first output;
 a second output;
 a pull-up circuit, comprising:
  a first transistor;
  a second transistor cross-coupled with the first transistor;
  a third transistor, controlled by the first transistor, and configured to pull up the first output;
  a fourth transistor, controlled by the second transistor, and configured to pull up the second output; and
 a pull-down circuit, comprising:
  a fifth transistor configured to pull down the first output; and
  a sixth transistor configured to pull down the second output;
  wherein the fifth transistor and the sixth transistor are cross-coupled;
 wherein the pull-up circuit further comprises a seventh transistor, controlled by the first output, and configured to pull down a control terminal of the second transistor.

2. A sense amplifier, comprising:
an input stage comprising a clocked differential amplifier; and
an output stage comprising:
 a first output;
 a second output;
 a pull-up circuit, comprising:
  a first transistor;
  a second transistor cross-coupled with the first transistor;
  a third transistor, controlled by the first transistor, and configured to pull up the first output;
  a fourth transistor, controlled by the second transistor, and configured to pull up the second output; and
 a pull-down circuit, comprising:
  a fifth transistor configured to pull down the first output; and
  a sixth transistor configured to pull down the second output;
  wherein the fifth transistor and the sixth transistor are cross-coupled;
 wherein the pull-up circuit further comprises a seventh transistor, controlled by the second output, and configured to pull down a control terminal of the first transistor.

3. A sense amplifier, comprising:
an input stage comprising a clocked differential amplifier; and
an output stage comprising:
 a first output;
 a second output;
 a pull-up circuit, comprising:
  a first transistor;
  a second transistor cross-coupled with the first transistor;
  a third transistor, controlled by the first transistor, and configured to pull up the first output;
  a fourth transistor, controlled by the second transistor, and configured to pull up the second output; and a pull-down circuit, comprising:
  a fifth transistor configured to pull down the first output; and
  a sixth transistor configured to pull down the second output;
  wherein the fifth transistor and the sixth transistor are cross-coupled;
wherein the pull-up circuit further comprises a reset circuit configured to pull up a control terminal of the first transistor, pull up a control terminal of the second transistor, pull up a control terminal of the third transistor, and pull up a control terminal of the fourth transistor.

4. A sense amplifier, comprising:
an input stage; and
an output stage coupled to the input stage, and comprising:
  a first output;
  a second output;
  a pull-up circuit comprising:
    a first transistor configured to pull up the first output;
    a second transistor configured to pull up the second output;
    a circuit configured to control the first transistor and the second transistor; and
a pull-down circuit comprising a circuit configured to pull-down the first output based on a voltage of the second output;
  wherein the circuit of the pull-up circuit comprises:
    a third transistor; and
    a fourth transistor cross-coupled with the third transistor;
wherein the pull-up circuit comprises a fifth transistor configured to pull down a control terminal of the fourth transistor based on a voltage of the first output.

5. A sense amplifier, comprising:
an input stage; and
an output stage coupled to the input stage, and comprising:
  a first output;
  a second output;
  a pull-up circuit comprising:
    a first transistor configured to pull up the first output;
    a second transistor configured to pull up the second output;
    a circuit configured to control the first transistor and the second transistor; and
    a pull-down circuit comprising a circuit configured to pull-down the first output based on a voltage of the second output;
  wherein the circuit of the pull-up circuit comprises:
    a third transistor; and
    a fourth transistor cross-coupled with the third transistor;
    wherein the pull-up circuit comprises a fifth transistor configured to pull down a control terminal of the third transistor based on a voltage of the second output.

6. A sense amplifier, comprising:
an input stage; and
an output stage coupled to the input stage, and comprising:
  a first output;
  a second output;
  a pull-up circuit comprising:
    a second transistor configured to pull up the second output;
    a circuit configured to control the first transistor and the second transistor; and
    a pull-down circuit comprising a circuit configured to pull-down the first output based on a voltage of the second output;
  wherein the circuit of the pull-up circuit comprises:
    a third transistor; and
    a fourth transistor cross-coupled with the third transistor;
  wherein the pull-up circuit comprises:
    a fifth transistor coupled to a first output of the input stage, and configured to pull down a control terminal of the third transistor based on a voltage at the first output of the input stage; and
    a sixth transistor coupled to a second output of the input stage, and configured to pull down a control terminal of the fourth transistor based on a voltage at the second output of the input stage.

7. A sense amplifier, comprising:
an input stage; and
an output stage coupled to the input stage, and comprising:
  a first output;
  a second output;
  a pull-down circuit coupled to the first and the second output; and
  a pull-up circuit coupled to the first node and the second output, the pull-up circuit comprising:
    a first transistor;
    a second transistor cross-coupled with the first transistor;
    a third transistor comprising:
      a control terminal coupled to an output terminal of the first transistor; and
      an output terminal coupled to the first output;
    a fourth transistor comprising:
      a control terminal coupled to an output terminal of the second transistor; and
      an output terminal coupled to the second output;
    a fifth transistor comprising:
      a control terminal coupled to the first output; and
      an input terminal coupled to a control terminal of the second transistor; and
    a sixth transistor comprising:
      a control terminal coupled to the second output; and
      an input terminal coupled to a control terminal of the first transistor.

8. The sense amplifier of claim 7, wherein the pull-up circuit comprises:
  a seventh transistor, comprising:
    a control terminal coupled to the input stage;
    an input terminal coupled to the control terminal of the first transistor; and
    an output terminal coupled to an output terminal of the fifth transistor; and
  an eighth transistor, comprising:
    a control terminal coupled to the input stage;
    an input terminal coupled to the control terminal of the second transistor; and
    an output terminal coupled to an output terminal of the sixth transistor.

9. The sense amplifier of claim 7, wherein the pull-down circuit comprises:
  a seventh transistor;
  an eighth transistor cross-coupled with the seventh transistor;

a ninth transistor comprising:
  a control terminal coupled to the input stage; and
  an input terminal coupled to:
    the first output;
    a control terminal of the eighth transistor; and
    an input terminal of the seventh transistor; and
a tenth transistor comprising:
  a control terminal coupled to the input stage; and
  an input terminal coupled to:
    the second output;
    a control terminal of the seventh transistor; and
    an input terminal of the eighth transistor.

10. The sense amplifier of claim 7, wherein the input stage comprises:
a seventh transistor;
an eighth transistor comprising an output terminal coupled to an output terminal of the seventh transistor; and
a reset circuit coupled to the seventh transistor and the eighth transistor, the reset circuit comprising:
  a ninth transistor comprising an output terminal coupled to an input terminal of the seventh transistor;
  a tenth transistor comprising an output terminal coupled to an input terminal of the eighth transistor; and
  an eleventh transistor comprising:
    a control terminal coupled a control terminal of the ninth transistor and to a control terminal of the tenth transistor;
    an input terminal coupled to an output terminal of one of the ninth transistor or the tenth transistor; and
    an output terminal coupled to an output terminal of one of the ninth transistor or the tenth transistor.

\* \* \* \* \*